(12) United States Patent
Markle et al.

(10) Patent No.: US 6,326,219 B2
(45) Date of Patent: *Dec. 4, 2001

(54) METHODS FOR DETERMINING WAVELENGTH AND PULSE LENGTH OF RADIANT ENERGY USED FOR ANNEALING

(75) Inventors: David A. Markle, Saratoga; Somit Talwar, Palo Alto; Andrew M. Hawryluk, Los Altos Hills, all of CA (US)

(73) Assignee: Ultratech Stepper, Inc., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/286,492

(22) Filed: Apr. 5, 1999

(51) Int. Cl.$^7$ .............................. H01L 21/00; H01L 21/84
(52) U.S. Cl. .............................. 438/14; 438/308; 438/795
(58) Field of Search ............................... 438/14, 308, 795

(56) References Cited

U.S. PATENT DOCUMENTS

| | | | |
|---|---|---|---|
| 4,319,954 | * 3/1982 | White et al. | 156/628 |
| 4,431,459 | * 2/1984 | Teng | 148/1.5 |
| 4,727,044 | 2/1988 | Yamazaki | 437/45 |
| 5,529,630 | 6/1996 | Imahashi et al. | 118/665 |
| 5,529,951 | 6/1996 | Noguchi et al. | 437/174 |
| 5,561,081 | 10/1996 | Takenouchi et al. | 437/174 |
| 5,620,910 | * 4/1997 | Teramoto | 438/151 |
| 5,643,801 | 7/1997 | Ishihara et al. | 437/7 |
| 5,648,276 | 7/1997 | Hara et al. | 437/21 |
| 5,688,715 | 11/1997 | Sexton et al. | 437/173 |
| 5,714,404 | 2/1998 | Mitlitsky et al. | 437/233 |
| 5,753,542 | 5/1998 | Yamazaki et al. | 438/162 |
| 5,923,963 | * 7/1999 | Yamanaka | 438/157 |

* cited by examiner

Primary Examiner—Richard Booth
(74) Attorney, Agent, or Firm—Allston L. Jones

(57) ABSTRACT

The invention is directed to methods for determining the wavelength, pulse length and other important characteristics of radiant energy used to anneal or to activate the source and drain regions of an integrated transistor device which has been doped through implantation of dopant ions, for example. In general, the radiant energy pulse is determined to have a wavelength from 450 to 900 nanometers, a pulse length of 0.1 to 50 nanoseconds, and an exposure energy dose of from 0.1 to 1.0 Joules per square centimeter. A radiant energy pulse of the determined wavelength, pulse length and energy dose is directed onto the source and drain regions to trigger activation. In cases where the doped region has been rendered amorphous, activation requires crystallization using the crystal structure at the boundaries as a seed. In this case the radiant energy pulse causes the source and drain regions to crystallize with the same crystallographic orientation as the underlying substrate with the dopant ions incorporated into the crystalline lattice so that the source and drain regions are activated. To enhance absorption of the radiant energy used for annealing the doped regions, an anti-reflective layer can be formed over the doped regions before exposure. The radiant energy can be generated by a laser or other relatively intense, pulsed, radiant energy source. Selection of the source should be based on efficiency, the ability to distribute energy uniformly over an extended area and the ability to accurately control the energy content of a single pulse.

85 Claims, 15 Drawing Sheets

METHODS FOR DETERMINING WAVELENGTH AND PULSE LENGTH OF RADIANT ENERGY USED FOR ANNEALING

GOVERNMENT RIGHTS

This invention was made with Government support under contract number N66001-95-C-8002 awarded by the Space and Naval Warfare Systems Command, San Diego. The Government has certain rights in the invention.

BACKGROUND OF THE INVENTION

1. Field of the Invention

This invention is directed to a method for determining the wavelength and pulse length of radiant energy used to anneal amorphous semiconductor regions, or to activate doped semiconductor regions, disposed in contact with crystalline semiconductor substrates. The radiant energy can be generated by a laser, flash-lamp or other relatively intense radiant energy source. The method can also be used to perform activation annealing of doped source and drain regions of integrated transistor devices, for example.

2. Description of the Related Art

In the integrated electronic circuit fabrication industry, ion implantation is often used to introduce dopants of appropriate conductivity type (i.e.,—or p-type) into the source and drain regions of integrated transistors. The implantation of the dopant atoms breaks chemical bonds in the source and drain regions of the integrated transistors and, in some instances, can render such regions amorphous. To obtain proper electrical performance of the integrated transistors, the source and drain regions must be annealed to bring such regions to a relatively crystalline state aligned with the substrate and/or to 'activate' such regions by incorporating the dopant atoms into the semiconductor crystalline lattice. One technique for performing annealing uses relatively intense radiant energy from a laser or flash-lamp, for example, to melt and crystallize the amorphous regions, or to heat the doped region sufficiently for activation.

Currently, the wavelength, energy dose and pulse length used for radiant energy annealing are determined largely by trial and error, and little thought has heretofore been given to determining relatively effective wavelength and pulse length for the radiant energy without performing numerous experiments. It would be desirable to provide a method which can be used to derive a wavelength and pulse length appropriate for radiant energy annealing, without the need to perform numerous experiments.

In addition, previous methods typically use energy doses in excess of the dose necessary to anneal an integrated device. The excess energy can damage the integrated device by overheating its components or by diffusing dopants beyond safe boundaries to create leakage paths. It would therefore be desirable to provide a method that can minimize, or at least reduce, the amount of energy required to anneal a semiconductor region, relative to previous methods.

In addition, improvement in the determination of the wavelength and pulse length of the radiant energy used for annealing an integrated device and/or circuit would generally permit enhancement of the process margin, leading to relaxed constraints on the materials and process steps used in integrated device or circuit fabrication processes, as well as improvement in the yield of properly functioning integrated devices and circuits, relative to previous methods.

SUMMARY OF THE INVENTION

The invented methods achieve the above-stated objects of the invention, and overcome the above-stated disadvantages of previous methods. Generally stated, the invented methods include a step of determining the wavelength and/or pulse length of radiant energy used to anneal at least one relatively disordered semiconductor region situated in contact with a crystalline semiconductor substrate. As used herein, the term 'disordered region' can refer to an amorphous semiconductor region(s) that is to be annealed by melting and crystallizing such region so that is assumes a crystalline state that is crystallographically aligned with the semiconductor substrate. The term 'disordered region' can also refer to a doped or implanted semiconductor region(s) in contact with a crystalline semiconductor substrate, that is to be annealed by heating through exposure to radiant energy and subsequent cooling for crystallization, to incorporate the doped or implanted atoms into the crystalline lattice of the semiconductor region.

The invented methods are useful and can be used in electronic device integration processes which involve the implantation of dopant ions into the source and drain regions of the integrated transistor devices formed on a semiconductor substrate. Such implantation often disorders the source and drain regions to a depth dependent on the dosage, atomic weight of the dopant species, and the energy used to implant the dopant ions into the substrate. The invented methods are useful in melting and crystallizing the disordered semiconductor regions resulting from ion implantation, or to activate the source and drain regions after doping, to obtain proper electrical performance of the integrated devices.

The invented methods utilize radiant energy from a laser, flash-lamp or other device, for example, preferably with an energy or a wavelength and pulse-duration that is effective for annealing the disordered region. Since there will inevitably be variations in the energy and the temporal shape and spatial distribution of energy in each pulse, the determined wavelength and pulse length are deemed effective if they yield relatively wide process margins and use a relatively small amount of power to anneal a disordered region on the substrate.

In the performance of relatively specific embodiments of the invented methods, it is generally desirable to confine the dopant impurity to the region where it was implanted so that the junction between the disordered region and the substrate, remains shallow. Prolonged heating would promote diffusion of the impurity atoms into the substrate, and results in a much less desirable, deeper junction. In the case where the dopant is contained in a disordered region that is amorphous, it is highly desirable that after heating with radiant energy, the crystal growth begin at the amorphous region-crystalline substrate interface so the result is a single crystal aligned to the crystal axis of the substrate. In other words, it is desirable to produce a temperature profile by exposure to the radiant energy so that the crystalline substrate acts as a seed for crystallization of the disordered region upon cooling. If the material composing the amorphous region were to begin crystallization at some other point then a much less desirable polycrystalline junction would likely result.

In the invented methods, the wavelength of the radiant energy used for annealing the disordered semiconductor region(s) is determined based on at least one, and preferably all, of the following criteria:

(1) the radiant energy at the wavelength has an absorption length in the disordered region that is greater than or equal to one-third ($\frac{1}{3}$) of the thickness of such region;

(2) the radiant energy at the wavelength has an absorption length in the disordered region that is less than or equal to five times the thickness of the disordered region or one micron, whichever is larger;

(3) the radiant energy at the wavelength has an absorption length in the crystalline substrate that is at least twice the absorption length of the wavelength in the disordered region;

(4) the absorption of radiant energy at the wavelength in the field isolation region used to electrically isolate the disordered region, is less than half as much as that through a similar thickness of the disordered region;

(5) the radiant energy at the wavelength can be efficiently generated, can be uniformly distributed over a relatively extended area, and the energy content of a single pulse can be controlled with relative accuracy; and/or (6) the radiant energy at the wavelength that is absorbed in the gate conductor layer and the underlying gate insulator layer is not substantially greater than the radiant energy absorbed in a similar thickness of the disordered region.

In general, the inventors have determined that the photon wavelength range for annealing radiant energy which satisfies the above-stated criteria for a disordered region composed of silicon in contact with a crystalline silicon substrate and electrically isolated by a silicon dioxide field isolation region, is from four-hundred-fifty (450) to nine-hundred (900) nanometers.

In the invented methods, the pulse length of the radiant energy used to anneal the disordered regions is determined based on at least one, and preferably all, of the following criteria:

(1) the pulse length is sufficiently short for a predetermined dose of radiant energy so that less than fifty percent of the radiant energy absorbed by the disordered semiconductor region is conducted into the adjacent crystalline substrate before the end of the pulse;

(2) the pulse length is sufficiently long for a predetermined dose of radiant energy to allow thermalization at least within the disordered region, i.e., the pulse length should be applied for at least as long as required for the temperature of the atomic nuclei of the disordered region to come into equilibrium with that of the electrons initially responsible for absorbing the incident radiant energy in the disordered region; and/or (3) the pulse length is sufficiently long to permit thermal energy from the absorbed radiant energy to diffuse within the volume of the disordered region during the interval of the laser pulse, i.e. the pulse length is greater than $Da^2/a$, where Da is the thickness of the disordered region and a is the thermal diffusion coefficient of the disordered region.

In general, the inventors have determined that a pulse length for the annealing radiant energy in a range from one-tenth (0.1) to fifty (50) nanoseconds satisfies the above-stated criteria for typical complementary-metal-oxide-semiconductor (CMOS) devices. Preferably, the energy dose of the radiant energy pulse used to anneal the disordered region(s) is in a range from one-tenth (0.1) to one (1.0) Joules per square centimeter.

Depending upon the reflectivity of the disordered semiconductor region(s), it is possible that a substantial proportion of the incident radiant energy used in the annealing step is reflected before it can be absorbed by the disordered region. The invented methods can therefore include a step of forming an anti-reflective layer over at least the disordered region to increase the absorption of the incident radiant energy. Such layer can be composed of an oxide of the semiconductor substrate, for example, and is preferably formed to a thickness determined by the following equation:

$$\text{anti-reflective layer thickness} = (k \cdot /)/(4 \cdot n)$$

where / is the wavelength of the radiant energy, n is the index of refraction of the anti-reflective layer, and k is an odd integer. The anti-reflective layer ensures that a sufficient proportion of the radiant energy, generally over ninety percent of the incident flux, is transmitted into the disordered regions for melting, crystallization and/or activation.

These together with other features and advantages, which will become subsequently apparent, reside in the details of the invention as more fully hereinafter described and claimed, reference being made to the accompanying drawings, forming a part hereof wherein like numerals refer to like parts throughout the several views.

DESCRIPTION OF THE PREFERRED EMBODIMENTS

Figure 1A:
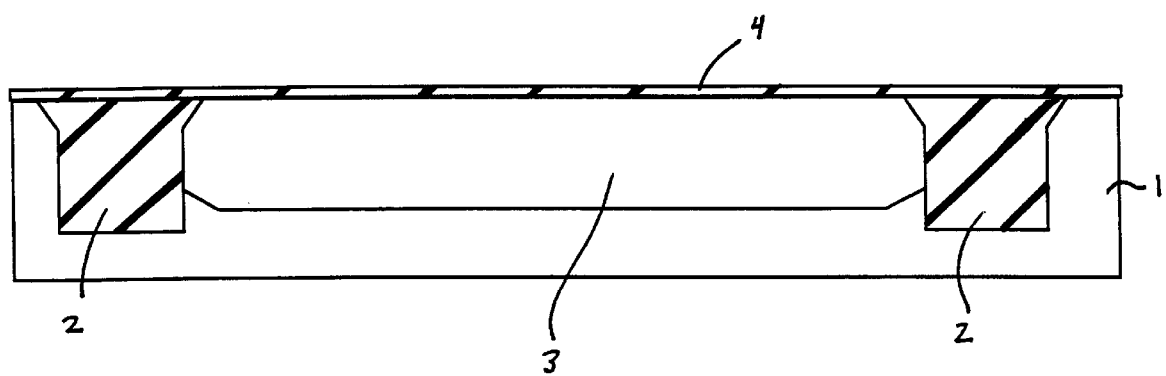
FIGS. 1A–1G are cross-sectional views of steps to form an integrated device through the use of relatively short pulse radiant energy annealing in accordance with the invented methods.

As used herein, the following terms have the following meanings:

"Absorption length" is a well-known parameter, and is defined as the thickness of a particular material required to reduce the intensity of radiant energy propagating in such material to 1/e, or 36.8 percent, of its initial intensity;

"Anneal" includes "activation", "crystallization" or "recrystallization" within its scope, and refers to raising and subsequently lowering the temperature of a semiconductor region either to crystallize the semiconductor region to be integral with a semiconductor substrate, or to activate dopants by incorporating them into the crystalline lattice of the semiconductor region;

"Depth" refers to the distance to which a region extends into the substrate in a direction perpendicular to the substrate's upper surface as viewed in the perspective of the Figures;

"Disordered region" refers to a semiconductor region in which the atoms contained therein are not relatively ordered either because they are in a non-crystalline state due to damage or amorphization caused by implantation of dopant or non-dopant atoms, and/or because they include dopant atoms that have not been incorporated into the crystalline lattice of such region by activation, for example. "Radiant energy" refers to photons such as can be generated by a laser or flash-lamp, for example;

"Thermal diffusion coefficient" is defined as $k/r \cdot C$ where k is the thermal conductivity (J/sec·cm·° C.), r is the density ($gm/cm^3$), and C is the heat capacity (J/gm·° C.);

"Thickness" refers to the distance between the upper and lower surfaces of a region or layer in a direction perpendicular to such surfaces as viewed in the perspective of the Figures;

"$M^2$" is the measure of the quality of a laser beam. If one takes a laser and focuses it with a lens, "M" is defined as the ratio of the divergence angle of a laser at the beam waist, relative to the divergence angle of a diffraction limited spot.

One embodiment of the invented methods for making an integrated transistor device, and more specifically, for annealing the source and drain regions of an integrated transistor device through the use of a relatively short pulse of radiant energy, is now described in detail with reference in FIGS. 1A–1H. Although for the sake of simplicity the methods are described herein in relation to making a single integrated transistor device (e.g., a metal-oxide-semiconductor field-effect transistor ("MOSFET") or a metal-insulator-semiconductor field-effect transistor ("MISFET")), those of ordinary skill in this technology will understand that the invented methods are applicable to, and are generally intended for, use in connection with the simultaneous manufacture of large numbers of integrated devices incorporated in integrated circuits formed on a semiconductor wafer substrate. Therefore, the description of the method as applied to the manufacture of a single integrated transistor device is not intended to exclude the possibility of forming numerous integrated devices with the invented methods.

In the invented methods, an integrated device is formed on a crystalline substrate 1 of the appropriate semiconductor material and crystallographic orientation, as shown in FIG. 1A. Substrate 1 can be a semiconductor material such as silicon (Si), preferably in the form of a single crystal substrate. If substrate 1 is composed of silicon, the substrate surface can be defined by a <100> orientation for MOSFET or MISFET devices, and by <100> or <111> orientations for bipolar transistors, for example. Typical substrates are about seven-hundred-and-fifty (750) microns in thickness, so it should be understood substrate 1 as well as other elements in the Figures are not necessarily shown to scale as for size for each element or ratio of sizes between elements, for simplification thereof.

Substrate 1 is selectively oxidized using a resist layer (not shown) and thermal oxidation, remote plasma oxidation or chemical vapor deposition, for example. This is well-known technology, to form a field isolation region 2 which bounds an active area of the substrate in which the integrated device is to be formed. In a typical case in which substrate 1 is composed of silicon, the oxidation step forms field isolation region 2, which is composed of silicon dioxide ($SiO_2$). The size of the active area of substrate 1 depends upon the desired integration density, and can be sub-micron in size. Field isolation region 2 serves to electrically isolate the integrated devices formed on the substrate from each other as well as from outside electromagnetic disturbances, and extends into the substrate to a depth that is sufficient to accomplish this purpose. In general, the thickness of field isolation region 2 can be in a range from one hundred (100) to one thousand (1,000) nanometers to achieve appropriate electrical isolation of the active area. It should be understood that the configuration of field isolation region 2 as shown in the Figures is representative only, and actual field isolation regions can have more rounded features and extend more deeply into substrate 1 than illustrated in the Figures. The oxidation process used to form field isolation region 2 can be performed with a wide variety of commercially-available chambers or other devices.

Dopants of appropriate conductivity type are introduced into substrate 1 to form a well region 3. If the integrated device is to be an n-channel device, n-type dopants such as phosphorus (P), arsenic (As), antimony (Sb), bismuth (Bi), selenium (Se), and tellurium (Te), for example, are implanted into substrate 1 to form the well region 3. Conversely, if the integrated device is to be a p-channel device, p-type dopants such as boron (B), aluminum (Al), gallium (Ga), beryllium (Be), magnesium (Mg) or zinc (Z), for example, are implanted into substrate 1 to form well region 3. For example, dopants can be introduced to well region 3 by diffusion or ion implantation, using well-known processes and chamber equipment. Implantation of dopants can be performed with a wide variety of machines, such as the 9500 XR Ion Implanter™ commercially-available from Applied Materials Inc. of Santa Clara, Calif. In general, the depth of well region 3 can be on the order of tens to hundreds of nanometers and can be formed by implanting ions at energies from two (2) to one-hundred (100) kilo electron-Volts (keV) at a dosage from $10^{13}$ to $10^{18}$ ions per square centimeter. If implantation is used to introduce dopants into well region 3, thermal annealing at a temperature of approximately 800–1200° C. for a few minutes to several hours can be used to incorporate the dopant impurity atoms into the surrounding crystal lattice. Alternatively, annealing with radiant energy can be used for activation in well region 3. The wavelength and pulse length for radiant energy used to anneal well region 3 can be determined based on the depth of the well region, the absorption length of the annealing radiant energy wavelength in the well region and the substrate, the thermal diffusion coefficient in the well region, and other pertinent parameters, as will subsequently become more clear in the description provided with respect to the source and drain regions in FIG. 1E.

In FIG. 1A, a gate insulator layer 4 is formed on substrate 1. Gate insulator layer 4 can be formed of silicon dioxide ($SiO_2$), silicon nitride ($Si_3N_4$), aluminum oxide ($Al_2O_3$), titanium oxide ($TiO_2$) or barium strontium titanium oxide ($BaSrTiO_3$), for example, which have relatively high melting temperatures. If the conditions of subsequent steps of the invented methods are such that gate insulator layer 4 would not be damaged, lower melting temperature materials can be used for the gate insulator layer as well. Gate insulator layer 4 can be formed using a variety of techniques and commercially-available equipment, including those that utilize thermal oxidation, remote plasma oxidation and chemical vapor deposition.

Figure 1B:
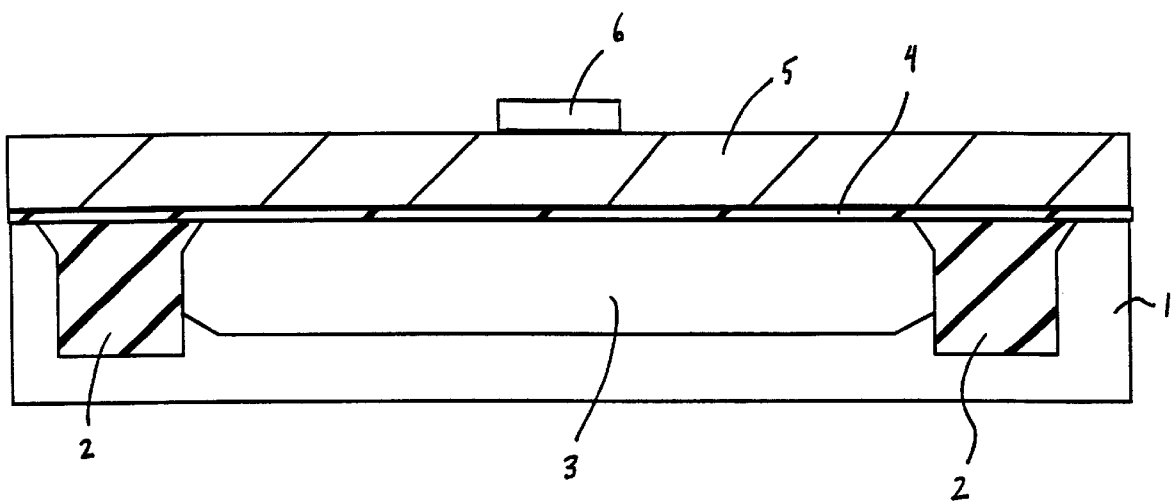

The thickness of gate insulator layer 4 depends upon the scaling of the integrated device, and is generally on the order of many tens to hundreds of nanometers in thickness for device integration densities of about one micron or less. Gate insulator thicknesses less than thirty (30) nanometers can be employed for sub-micron integration densities. In FIG. 1B, a gate conductor layer 5 composed of an electrically conductive material is formed over gate insulator layer 4. For example, gate conductor layer 5 can be composed of a material such as polysilicon or various metals. Such metals include titanium (Ti), tungsten (W) or molybdenum (Mo), for example, which can withstand the relatively high-temperature device integration process steps. Lower-temperature metals such as aluminum, copper or gold, can be used if gate conductor layer 5 is not heated to its melting temperature by subsequent steps of the invented methods. Gate conductor layer 5, can be formed by chemical vapor deposition or plasma-enhanced chemical vapor deposition, for example. The thickness of gate conductor layer 5 depends upon the device integration density, and is generally from one-hundred (100) to one-thousand (1,000) nanometers for integration densities on the order of one micron or less.

In FIG. 1B, a resist layer 6 is formed over gate conductor layer 5. As is well known in this industry, resist layer 6 can be formed on gate conductor layer 5 by spin-coating the resist onto the gate conductor layer. Resist layer 6 can be selectively exposed using conventional photolithography techniques and equipment. The exposed resist layer 6 is developed using commercially-available developers and well-known techniques, to pattern resist layer 6 to overlie a limited portion of substrate 1 in which the gate region of the integrated device is to be formed, as shown in FIG. 1B. After patterning, resist layer 6 can be baked to make such layer more resistant to etching.

Figure 1C:
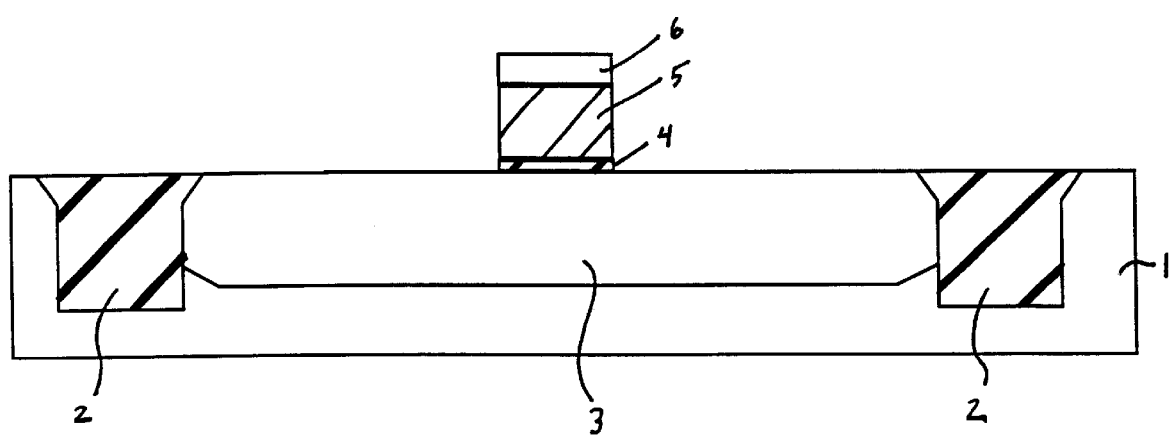

In FIG. 1C, gate insulator layer 4 and gate conductor layer 5 are selectively etched through the use of resist layer 6 so that only those portions of the layers 4 and 5 underlying resist layer 6 remain on substrate 1. The remaining material defines the integrated device's gate region. The etching of the layers 4 and 5 can be performed using a variety of well-known etchants and techniques, such as by bathing substrate 1 in acids or by reactive ion etching, for example.

Figure 1D:
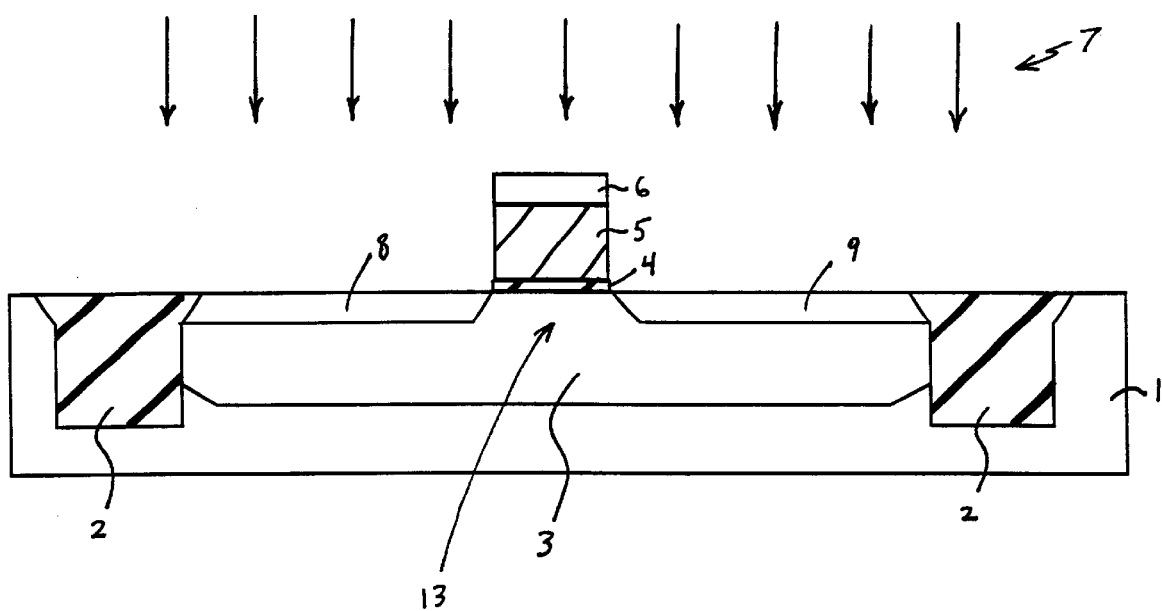

In FIG. 1D, dopant ions 7 are implanted into the source and drain regions 8 and 9 of the integrated transistor device. The dopant atoms have the opposite conductivity type as that of a channel region 13. Thus, if the channel region is p-type, the ions implanted into source and drain regions 8 and 9 are n-type. Conversely, if the channel region is n-type, the ions implanted into source and drain regions 8 and 9 are p-type. The implantation of dopant atoms into source and drain regions 8 and 9 causes such regions to be relatively disordered, possibly to the point of being amorphous, because the dopant ions have sufficient energies to destroy chemical bonds in source and drain regions 8 and 9 as they penetrate such regions. Amorphization of source and drain regions 8 and 9 lowers the melting temperature of such regions below that of the crystalline substrate 1. For example, assuming a typical case in which substrate 1 is composed of silicon, source and drain regions 8 and 9 have a melting temperature of about 1100° C. after amorphization. This is well below the 1410° C. melting temperature of crystalline silicon. Assuming the preferred case, in which the materials composing the regions 2, 3, 4 and 5 have melting temperatures above 1410° C., the 300° C. difference in the melting temperatures of disordered regions 8 and 9 relative to substrate 1 is a good measure of the process margin. Alternatively, if the disordered source and drain regions are not doped to the point of becoming amorphous, but are relatively disordered because the dopant atoms are not situated within the crystalline lattice of the regions 8 and 9, the dopant atoms can be activated by heating the source and drain regions sufficiently (typically to approximately 1000° C.). In this case the process margin is the difference in temperature between the activation temperature and the melting temperature of crystalline silicon (1410° C.).

Implantation of dopant ions can be performed with a wide variety of commercially-available equipment, such as the 9500 XR Ion Implanter™ previously mentioned. In general, the depth of disordered source and drain regions 8 and 9 relative to the surface of substrate 1 can be from ten to a few hundred nanometers. Generally, source and drain regions 8 and 9 can be formed by implanting ions at energies from two (2) to one-hundred (100) kilo-electron Volts (keV) at a dosage from $10^{13}$ to $10^{18}$ ions per square centimeter. In general, implanting dopant ions with relatively low atomic weight, increasing the ion implantation energy, or increasing the ion dosage, will each have the effect of increasing the depth to which the doped regions 8 and 9 extend into substrate 1. Conversely, implanting dopant ions with relatively large atomic weights, decreasing the ion implantation energy, or decreasing the ion dosage, will each have the effect of decreasing the depth to which the doped regions 8 and 9 extend. Importantly, the depth of disordered source and drain regions 8 and 9 from the substrate's surface into the substrate's interior should be determined because knowledge of such depth is required to determine the appropriate wavelength and pulse length of the radiant energy used to anneal source and drain regions 8 and 9 as described with reference to FIG. 1E. The depth of source and drain regions 8 and 9 can be determined from the dosage, atomic species of the dopant ions, and the implantation energy of the dopant ions, using a variety of widely-available publications which list implantation depths for various substrates as a function of these parameters. Alternatively, the depth to which source and drain regions 8 and 9 extend can be determined through Rutherford back scattering with commercially-available equipment to determine the location and amount of the implanted ions. Such techniques are disclosed, for example, in "Ion implantation: basics to device fabrication" by Emanuele Rimini, copyright 1995 by Kluwer Academic Publishers, Inc., Norwell, Mass. The depth of disordered source and drain regions 8 and 9 is important to determine the optimum wavelength and pulse length of the radiant energy used to anneal such amorphous regions in the annealing step as described below.

Figure 1E:
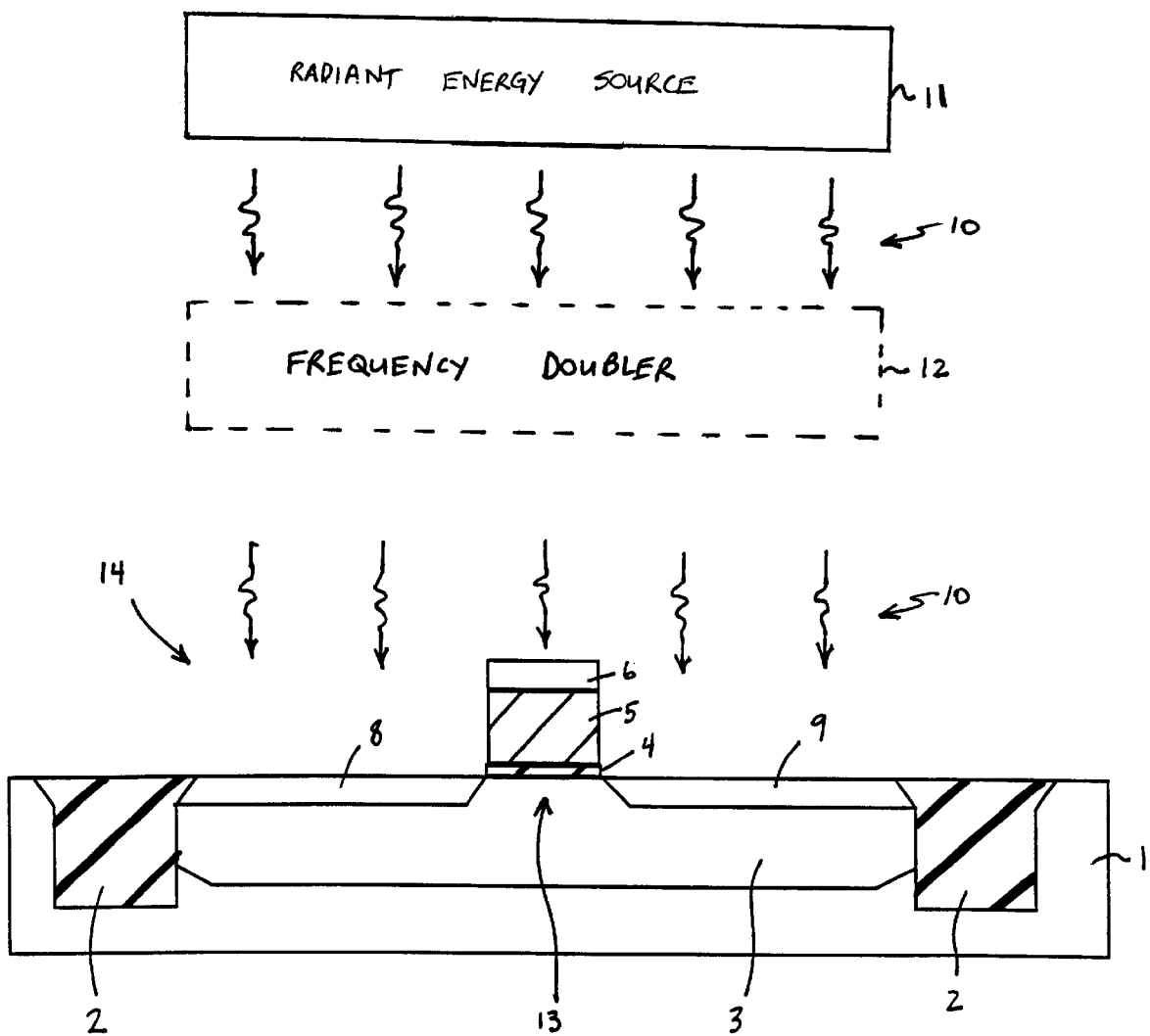

In FIG. 1E, doped regions 8 and 9 are exposed with radiant energy 10 from a radiant energy source 11. Radiant energy 10 propagates through an optional frequency doubler 12 positioned between source 11 and doped regions 8 and 9. Importantly, the wavelength and pulse length of the radiant energy are determined so that disordered regions 8 and 9 are heated sufficiently by the absorbed radiant energy for crystal growth or dopant activation to be initiated while substrate 1 (including well region 3 and its channel region 13), field isolation regions 2, gate insulator layer 4, and gate conductor layer 5 remain unmelted. Assuming substrate 1 is composed of silicon, the annealing radiant energy heats the doped region to a temperature between 900° C. to 1410° C. As a result of exposure to radiant energy 10, source and drain regions 8 and 9 are transformed or converted from a relatively disordered state into an electrically-activated, crystalline state. More specifically, for the case of an amorphous source and drain, heating source and drain regions 8 and 9 sufficiently by exposure to radiant energy causes source and drain regions to melt up to the crystalline boundary of substrate 1 which acts as a seed for recrystallization after exposure to the radiant energy. In this case source and drain regions 8 and 9 are melted by the radiant energy and recrystallize with the same crystallographic orientation as the channel region 13, so that integrated device 14 exhibits proper electrical performance. In the case where the source and drain are disordered by doping, but not to the point of becoming amorphous, a similar result is achieved by heating source and drain regions 8 and 9 to the activation temperature. Therefore, after annealing treatment with radiant energy 10, regions 8 and 9 are crystalline with some, if not most, of the dopant atoms embedded in their crystal lattices which have the same crystallographic orientation as substrate 1. The formerly disordered source and drain regions 8 and 9 are thus activated and crystallographically integral with substrate 1 by annealing with the radiant energy 10, for proper electrical performance of integrated device 14.

It should be appreciated that careful determination of the wavelength and pulse length of the radiant energy used to melt disordered source and drain regions 8 and 9 is necessary to achieve proper electrical performance. If the wavelength is too short or the pulse length too short for a predetermined radiant energy dose, the dose supplied to disordered regions 8 and 9 will ablate the surface.

Conversely, a wavelength that is too long will lead to relatively inefficient heating of the regions 8 and 9 with respect to the underlying crystalline substrate, thereby requiring a large energy dose that results in significant heating beyond the regions 8 and 9. In previous methods, the pulse length of the annealing radiant energy was determined by the time required to bring the entire substrate up to an annealing temperature and for a time sufficient for annealing. This approach inevitably resulted in some diffusion of the implanted impurities and a deeper junction than desired.

In the invented methods, the wavelength of radiant energy 10 used to anneal the disordered (i.e., doped) source and drain regions 8 and 9 is determined by the following criteria:

(1) the radiant energy at the wavelength has an absorption length in the disordered region that is greater than or equal to one-third (⅓) of the thickness of such region;

(2) the radiant energy at the wavelength has an absorption length in the disordered region that is less than or equal to five times the thickness of the disordered region or one micron, whichever is larger;

(3) the radiant energy at the wavelength has an absorption length in the crystalline substrate that is at least twice the absorption length of the wavelength in the disordered region;

(4) the absorption of radiant energy at the wavelength in the field isolation region used to electrically isolate the disordered region, is less than half as much as that through a similar thickness of the disordered region;

(5) the radiant energy at the wavelength can be efficiently generated, can be uniformly distributed over a relatively extended area, and the energy content of a single pulse can be controlled with relative accuracy; and/or (6) the radiant energy at the wavelength that is absorbed in the gate conductor layer and the underlying gate insulator layer is not substantially greater than the radiant energy absorbed in a similar thickness of the disordered region.

The criteria (1)–(3) ensure that the radiant energy wavelength will efficiently heat doped source and drain 8 and 9 to their boundaries within substrate 1 (i.e., to the boundary with well region 3 and its channel region 13), but not too far beyond (in most cases, it is not desirable for melting to proceed more than about one to a few tens of nanometers beyond the boundaries of source and drain region 8 and 9 prior to annealing). Criterion (4) ensures that field isolation regions 2 and gate insulator layer 4, which are generally composed of a dielectric material such as silicon dioxide, will not be heated above their respective melting temperatures by exposure to radiant energy 10. Criterion (5) ensures that there is a practical source 11 to be used for generating radiant energy 10 in the annealing step. More specifically, radiant energy sources such as lasers and flash lamps function at discrete wavelengths. The wavelength or wavelength range that is optimal under criteria (1)–(4) and (6) may not be one for which any radiant source exists that is commercially-available or even possible to manufacture. Accordingly, a radiant energy source at a wavelength that is close, and preferably as close as possible, to the optimal wavelength(s) should be used. Also, many laser sources are not quite coherent and, when applied to exposing relatively large areas such as an integrated circuit on a wafer substrate, exhibit a non-uniform speckle pattern in which the variation in intensity can be as high as 100%. Such non-uniform sources are not generally desired for use in generating radiant energy 10 to perform the annealing step of the invented methods. Furthermore, it is desirable to use a source 11 which can be readily controlled to generate a single pulse with relative accuracy. Criterion (6) addresses one of the main problems with laser processing; i.e. gate damage. If the absorption of energy in the gate region exceeds that in doped source and drain regions 8 and 9 then it is likely that gate conductor layer 5 will melt before doped source and drain regions 8 and 9 are activated.

In general, the inventors have determined that the wavelength range for radiant energy used in the annealing step which generally satisfies the above-listed criteria is from four-hundred-fifty (450) to nine-hundred (900) nanometers for a substrate 1 composed of silicon and a field isolation region 2 and gate insulator layer 4 composed of silicon dioxide.

One possibility for radiant energy source 11 is a laser, although other sources such as a flash lamp can be used to generate radiant energy 10. Although there are some commercially-available lasers which operate at wavelengths within the range from four-hundred-fifty (450) to eight hundred (900) nanometers, there are many different types of commercially-available lasers which operate at wavelengths from about nine-hundred (900) to sixteen-hundred (1,800) nanometers. Radiant energy sources operating in a wavelength range from nine-hundred to sixteen-hundred nanometers can be frequency-doubled to operate in the preferred range, four-hundred-fifty to nine-hundred nanometers, by the use of frequency-doubler 12. Exemplary lasers which operate in the range from nine-hundred to sixteen-hundred nanometers include solid-state varieties such as YAG lasers which operate at about one-thousand (1,000) nanometers and which are commercially-available from a large number of commercial sources. Other possibilities include Alexandrite and Ti:Sapphire lasers which operate in approximately the 760 nanometer portion of the spectrum. All of these lasers can be designed to emit a large number of spatial modes, which greatly improves the spatial uniformity that is achievable in a single pulse, and they can be frequency-doubled. To achieve a uniformity of 1% about 10,000 spatial modes are required for source 11 if implemented as a laser. This corresponds to an $M^2$ value of about 100. In general, any laser serving as radiant energy source 11 should have a minimum of one-thousand (1,000) spatial modes, or, equivalently, $M^2$ value greater than about 30.

Frequency doubler 12 can be a potassium diphosphide (KDP) or other crystal commercially-available from a number of sources, including Cleveland Crystals, Inc. of Cleveland, Ohio.

The length of radiant energy pulse 10 used to irradiate disordered source and drain regions 8 and 9 is determined according to the following criteria:

(1) the pulse length is sufficiently short for a predetermined dose of radiant energy so that less than fifty percent of the radiant energy absorbed by disordered semiconductor regions 8 and 9 is conducted into adjacent crystalline substrate 1 before the end of the pulse;

(2) the pulse length is sufficiently long for a predetermined dose of radiant energy to allow thermalization at least within disordered semiconductor regions 8 and 9, i.e., the pulse length should be applied for at least as long as required for the temperature of the atomic nuclei of the disordered regions to come into equilibrium with that of the electrons initially responsible for absorbing the incident radiant energy in the disordered regions (in general, this criteria requires a pulse length of at least 0.1 nanoseconds); and/or (3) the pulse length is sufficiently long to permit thermal energy from the absorbed radiant energy 10 to diffuse within the volume of the disordered regions during the interval of the laser pulse, i.e. the pulse length is greater $(Da)^2/a$, where the thickness of the disordered regions and a is the thermal diffusion coefficient of the disordered regions.

Satisfaction of criteria (1) can generally be determined by calculating or modeling the distribution of energy absorbed in the substrate at the end of the pulse. Thermal diffusion can be readily modeled to determine whether criteria (1) is satisfied by appropriate modification of diffusion modelers such as Suprem IV™ software available from Stanford University, Stanford, Calif., or TOPAZ™ software available from Lawrence Livermore National Laboratories, Livermore, Calif.

In general, the inventors have determined that a pulse length in a range from one-tenth (0.1) to fifty (50) nanoseconds satisfies the above-stated criteria for a substrate 1 composed of silicon and having field isolation regions 2 and gate insulator layer 4 composed of silicon dioxide. The ability to pulse the radiant energy output of source 11 is generally inherent in many of the commercially-available lasers and other radiant energy sources, which can be chosen to yield the pulse length determined based on the above-stated criteria.

As previously mentioned, the invented methods are described herein with reference to a single integrated device 13, but are generally applicable and preferred for use with substrates containing large numbers of integrated devices. Radiant energy source 11 generally produces a beam of radiant energy 10 covering a sufficient area to expose numerous integrated devices 13 in a single pulse. However, if the radiant energy beam area is insufficient to expose an integrated circuit with one pulse, the radiant energy beam area can be stepped relative to substrate 1 to expose overlapping areas thereof to anneal an entire integrated circuit or numerous integrated circuits formed on a semiconductor wafer substrate 1. Such scanning or stepping equipment for moving substrate 1 relative to the radiant energy area is well known in this industry and thus requires no detailed explanation.

The energy dose used for annealing must not be so large as to melt the entire area of integrated device 14, but yet must trigger dopant activation in source and drain regions 8 and 9. In the specific case of an implant that resulted in an amorphous source and drain region, the annealing step must result in recrystallation that extends all the way to the boundary of crystalline substrate 1 (or more specifically, well region 3). Preferably, the energy dose of radiant energy 10 used to anneal implanted regions 8 and 9 is in a range from one-tenth (0.1) to one (1.0) Joules per square centimeter. In general, if the thickness of implanted regions 8 and 9 is relatively large or if the absorption coefficient of such regions is relatively small, the dose of radiant energy 10 used to anneal such regions will be relatively large. Conversely, if the thickness of implanted regions 8 and 9 is relatively small, or if the absorption coefficient of regions 8 and 9 is relatively large, then the energy dose of radiant energy 10 used to anneal such regions will be relatively small. Determining the proper energy dose for radiant energy 10 to be used for annealing source and drain regions 8 and 9 therefore depends upon knowing the dimensions of integrated device 14 as well as the material properties.

Absorption lengths and diffusion coefficients at various wavelengths for the materials composing substrate 1 and source and drain regions 8 and 9, are well-known in this technology for a variety of materials, including amorphous and crystalline silicon and other materials. For example, a large amount of such information can be obtained from the American Institute of Physics Handbook, 3d Edition, copyright 1972, Dwight Gary, Editor. Interpolation of the data for various materials and material states can be used to derive the absorption lengths and diffusion coefficients for those wavelengths and materials not specifically stated therein.

The short pulse radiant energy annealing step of FIG. 1E can be performed with equipment such as the Laser Annealing Processing Tool™ commercially-available from Verdant Technology, Inc. of San Jose, Calif.

Figure 1F:
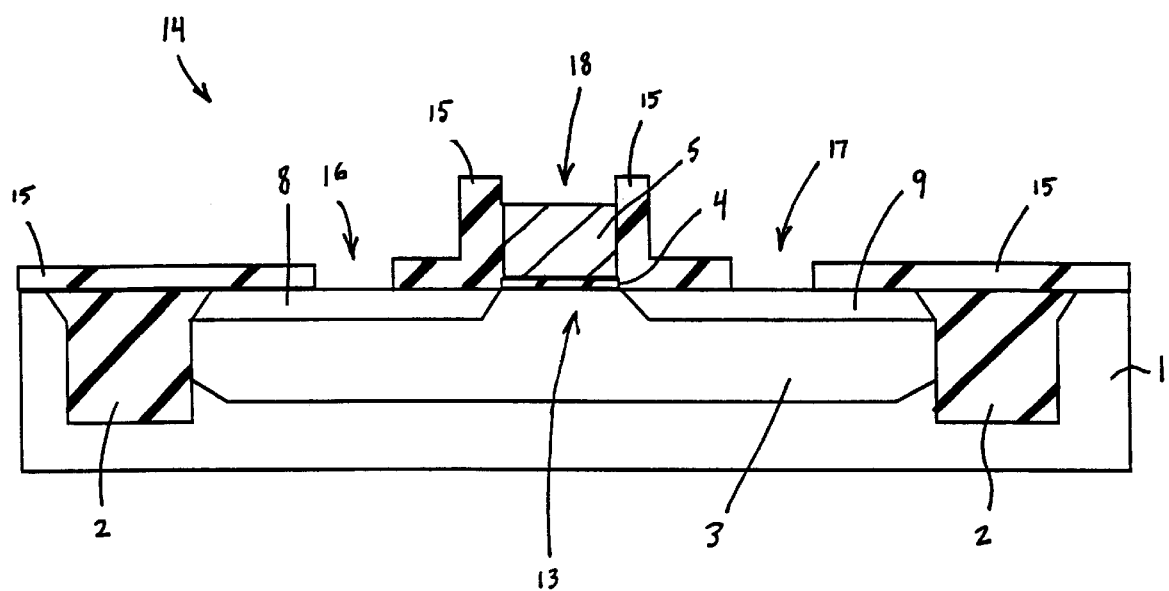

In FIG. 1F, resist layer 6 from FIG. 1E is removed from gate conductor layer 5, for example, by placing substrate 1 in a solvent or acidic bath. An insulator layer 15 is formed over substrate 1 by thermal oxidation, remote plasma oxidation, chemical vapor deposition or other such well-known technique. Insulator layer 15 can be composed of a dielectric material such as those previously mentioned for field isolation region 2 and gate insulator layer 4 (including silicon dioxide) or other dielectric materials. The insulator layer 15 is grown to a thickness sufficient to insulate the electrical conductors (not shown in FIG. 1F, but shown in FIG. 1G) that make electrical contact with integrated device 14. Insulator layer 15 can generally be formed to a thickness ranging from tens to hundreds of nanometers. Insulator layer 15 is patterned to define contact holes 16, 17 and 18 which expose source, drain, and gate regions 8, 9 and 5, respectively. The layer 15 can be patterned through the use of a resist layer (not shown) and an acidic bath, or reactive ion etching, or a variety of other well-known techniques. The resist layer is removed after use in defining the contact holes 16, 17 and 18 in the insulator layer 15.

Figure 1G:
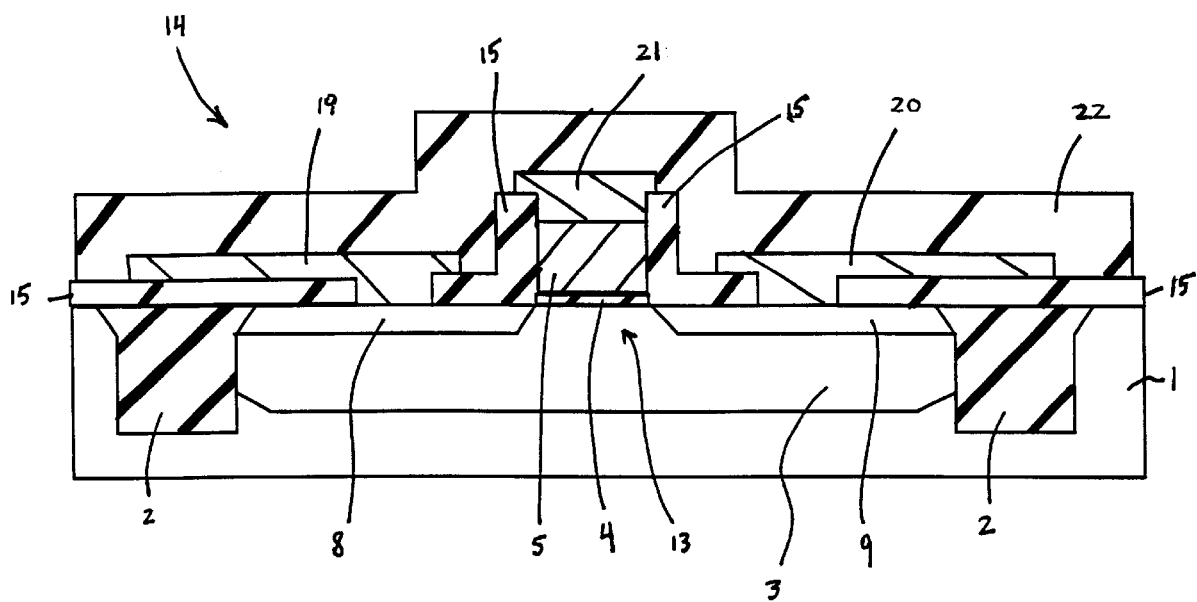

In FIG. 1G, an electrically conductive layer is formed over substrate 1. The electrically conductive layer can be composed of polysilicon, aluminum, copper, gold or alloys thereof, or high-temperature metals such as titanium or tungsten, for example. The metal layer can be formed by sputtering, chemical vapor deposition, or plasma enhanced chemical vapor deposition, for example. The electrically-conductive layer is patterned to define source, drain and gate conductive lines 19, 20, 21 which contact source, drain and gate regions 8, 9 and 5, respectively. The lines 19, 20 and 21 generally extend to and along field isolation region 2, and are used to establish electrical connections with other integrated devices formed on substrate 1, or power or signal sources, for example. An insulator layer 22 is formed over the lines 19, 20 and 21 for electrical insulation and protection of such lines. Insulator layer 22 is formed to a thickness sufficient to insulate and protect the lines 19, 20 and 21 and can be composed of the dielectric materials previously stated. For example, the insulator might be a layer of silicon dioxide, possibly doped with phosphorous to form "P-glass", or silicon nitride ($Si_3N_4$), formed through one of a variety of conventional techniques such as chemical vapor deposition or plasma-enhanced chemical vapor deposition.

Figure 2A:
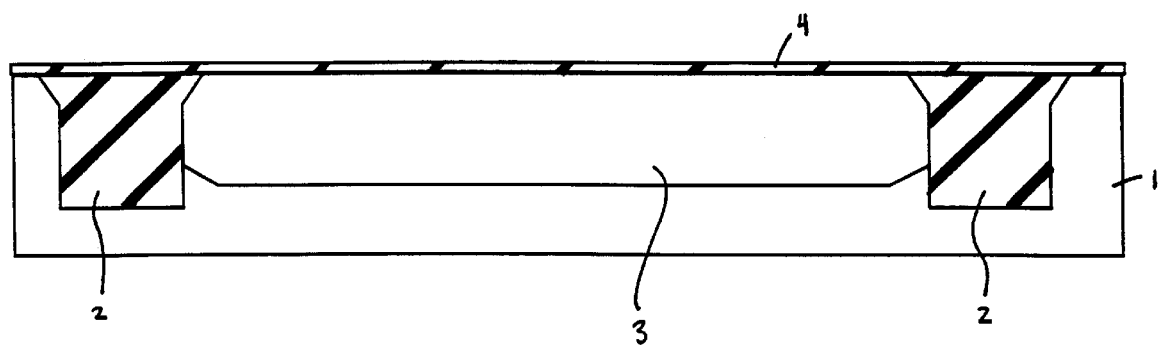
FIGS. 2A–2H are cross-sectional views of steps to form an integrated device which involves a step of forming an anti-reflective layer on the substrate to absorb radiant energy for annealing an integrated transistor device.
Figure 2B:
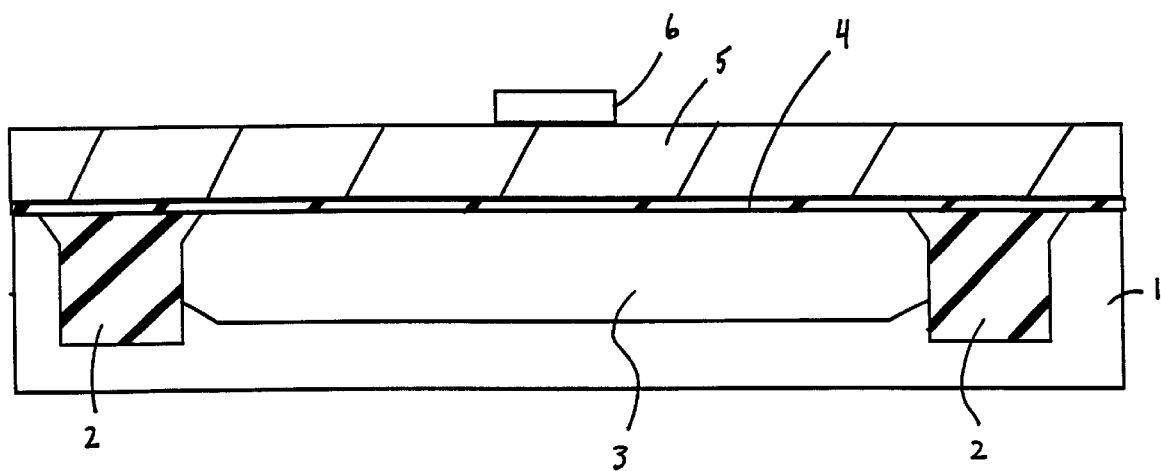
Figure 2C:
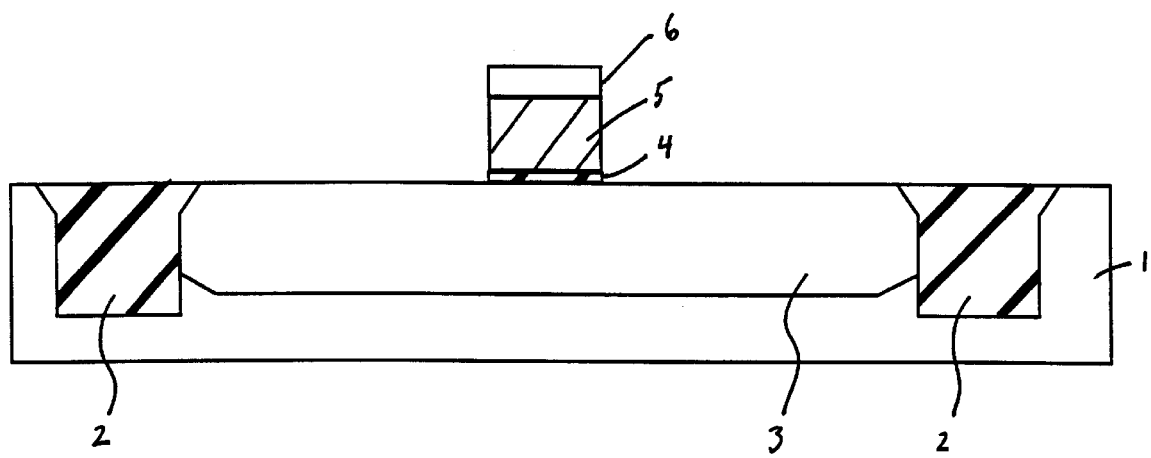
Figure 2D:
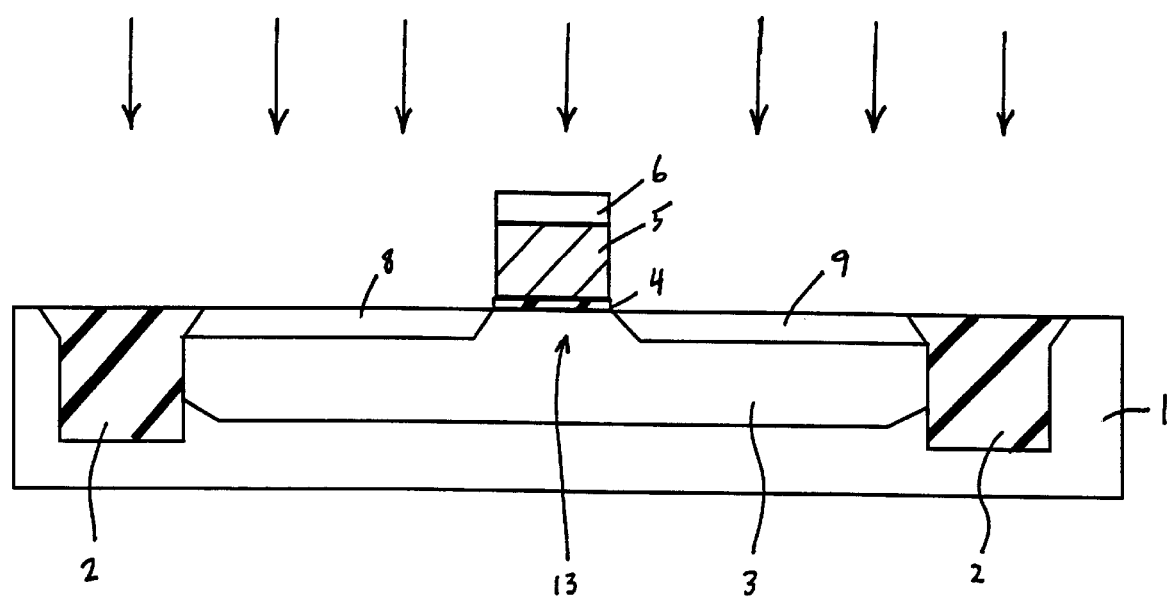
Figure 2E:
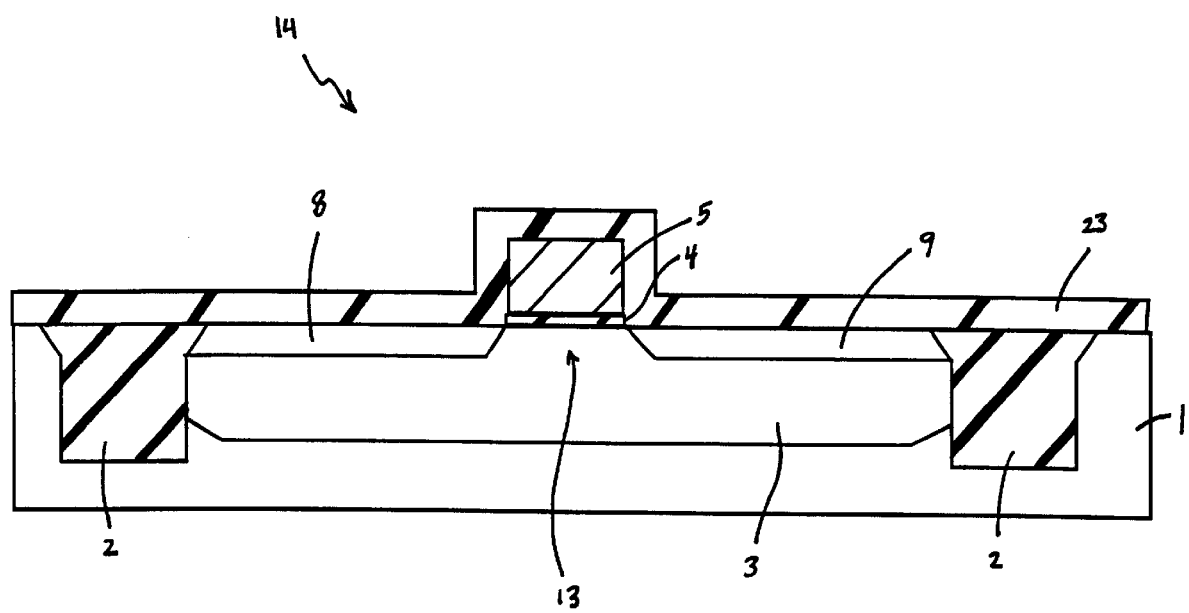

The reflectivity of source and drain regions 8 and 9 may be high enough to substantially reduce the radiant energy that refracts into such regions during exposure to radiant energy in the annealing step. The following method described with reference to FIGS. 2A–2G can be used to eliminate this problem. The device fabrication steps of FIGS. 2A–2D are the same as those previously described with reference to FIGS. 1A–1D, respectively. In FIG. 2E, resist layer 6 has been removed from gate conductor layer 5 with an acid or solvent, for example, and an anti-reflective layer 23 is formed over substrate 1. Anti-reflective layer 23 can be composed of an oxide of semiconductor substrate 1 such as silicon dioxide, or silicon nitride or other substances, preferably dielectric types. Anti-reflective layer 23 can be formed by thermal oxidation, chemical vapor deposition, plasma-enhanced chemical vapor deposition or other techniques. Importantly, anti-reflective layer 23 is formed with a thickness determined by the following equation:

$$\text{anti-reflective layer thickness} = (k \cdot \lambda)/(4 \cdot n)$$

where $\lambda$ is the wavelength of radiant energy 10 used for annealing source and drain regions 8 and 9, and n is the index of refraction of the anti-reflective layer, and k is an odd integer.

Figure 2F:
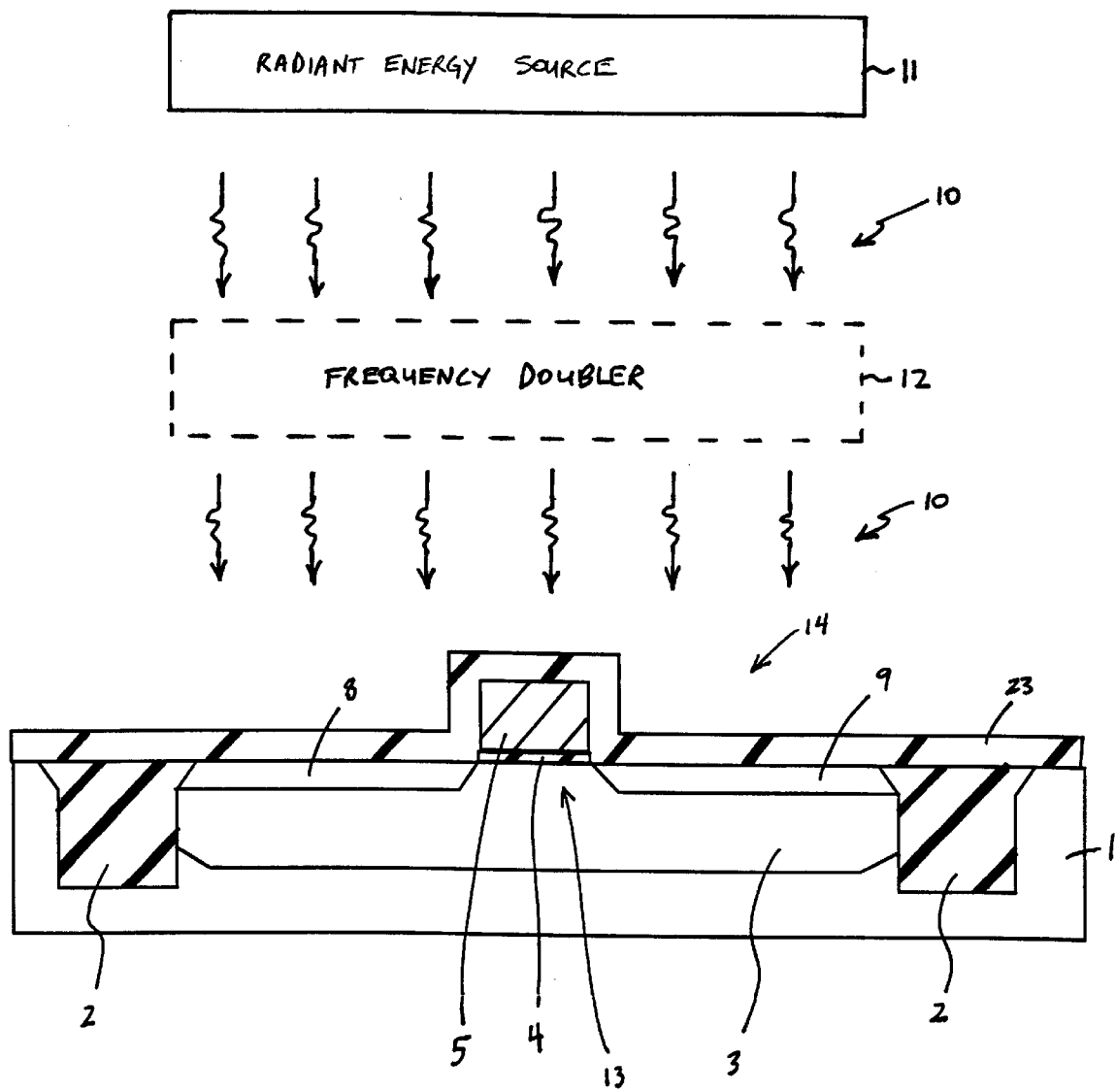
Figure 2G:
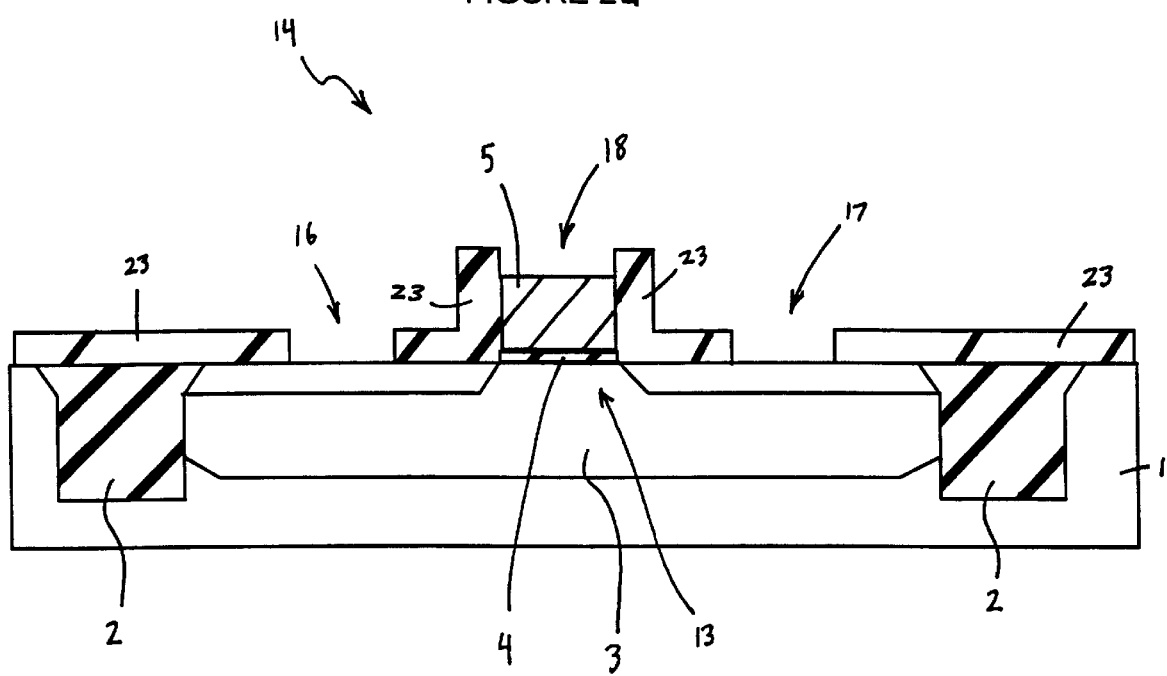
Figure 2H:
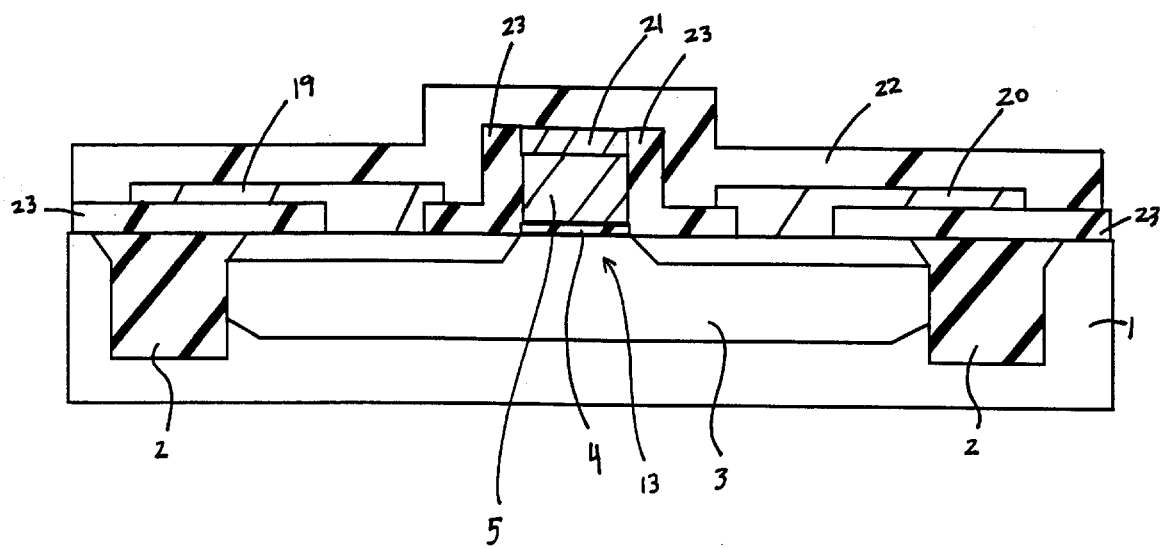

Anti-reflective layer 23 functions as an anti-reflective coating and ensures that sufficient radiant energy, generally over ninety-percent, is transmitted into disordered source and drain regions 8 and 9 for crystallization and dopant activation. In FIG. 2F, anti-reflective layer 23, and hence also the underlying source and drain regions 8 and 9, are exposed to radiant energy 10 after determining the appropriate wavelength, pulse length and energy dose of radiant energy 10, as previously described with reference to FIG. 1E. In FIG. 2G, contact holes 16, 17 and 18 are formed in anti-reflective layer 23 using techniques as previously described with reference to FIG. 1F. In FIG. 2H, conductive lines 19, 20 and 21 are formed to make electrical contact with source, drain and gate regions 8, 9 and 5, respectively, and an insulator layer 22 is formed over the substrate to protect and electrically insulate lines 19, 20 and 21, as previously described with reference to FIG. 1G.

Numerous modifications of the invented methods are possible within the scope of this invention. For example, some steps of the invented methods may be performed in a different sequence to that described herein. For example, dopants can be implanted through layer 4 after its formation on substrate 1, rather than before its formation, to produce well region 3 in FIGS. 1A and 2A. Also, the source and drain dopant implantation step in FIGS. 1D and 2D can be performed as two separate implantation steps; one to achieve amorphization of source and drain regions 8 and 9 to a desired depth; and the second to introduce the dopant ions in a concentration which will achieve pre-specified electrical performance objectives for integrated device 13. The amorphization implant is not necessarily a dopant atom (although it could be), but rather can be an atomic species that itself is of the same chemical valence as the substrate that has no impact upon the integrated device's electrical performance. For example, the amorphization can be produced by ions of the same species of which semiconductor substrate 1 is composed, such as silicon, for example. Two separate implantation steps can be used to achieve amorphization to a predetermined depth into substrate 1 in situations, for example, in which a predetermined dosage of a particular species of dopant ions would be insufficient to amorphize source and drain regions 8 and 9. Although it is generally preferred that anti-reflective layer 23 is an electrically-insulating material, anti-reflective layer 23 can be composed of other substances. In this case anti-reflective layer 23 can be removed and an insulator layer 15, such as that formed in FIG. 1F, can be added to provide electrical insulation except in those areas in which conductive lines 19, 20 and 21 are to make contact with source, drain and gate regions 8, 9, 5, respectively. Furthermore, anti-reflective layer 23 can be thickened after the annealing step if additional insulation is desired on substrate 1. An insulator stack can be composed of either the same or different insulating materials as that composing anti-reflective layer 23. Conductive lines 19, 20 and 21 were described as being defined through selective etching using a resist layer, however it is also possible to selectively deposit conductive materials. This might be done by protecting those areas where conductive material is not desired with a resist coating, before depositing the conductive material. Subsequent removal of the resist and the overlaying conductor then defines the conduction elements. In addition, in FIGS. 1A and 2A, dopants of appropriate conductivity type can be introduced into the channel region either before or after formation of gate insulator layer 4 to adjust the threshold voltage of integrated transistor device 13. Furthermore, rather than forming channel region 13 between source and drain regions 8 and 9 through the use of a generally doped well region 3, the channel region can be formed through a localized doping step. In this case the source, drain and channel regions could be formed on a native or uniformly doped substrate 1 without the need to form well region 3. Also, it should be appreciated that the invented methods can be applied to the formation of a bipolar transistor. In addition, it should be appreciated that the invented methods can be applied to the formation of diodes or other passive or active integrated devices. They can also be used in any other application in which it would be desirable to melt and recrystallize an amorphous region in contact with a crystalline region, so that the crystalline substrate acts as a seed for recrystallization of the amorphous region. These modifications are within the scope of this invention as envisioned.

The many features and advantages of the present invention are apparent from the detailed specification and thus, it is intended by the appended claims to cover all such features and advantages of the described methods which follow in the true spirit and scope of the invention. Further, since numerous modifications and changes will readily occur to those of ordinary skill in the art, it is not desired to limit the invention to the exact construction and operation illustrated and described, but rather to extend to equivalents thereof as well. Accordingly, all suitable modifications and equivalents may be resorted to as falling within the spirit and scope of the invention.

What is claimed is:

1. A method for converting a disordered region on a crystalline semiconductor substrate disordered by implantation of dopant ions back into crystalline structure, said method comprising the steps of:
   a) determining a thickness of said disordered region;
   b) determining a wavelength of said radiant energy based on at least the thickness of said disordered region;
   c) determining a pulse length of said radiant energy based on at least the thickness of said disordered region; and
   d) annealing said region with radiant energy as determined in steps b) and c) that is sufficient to melt only said disordered region without effecting the crystalline structure of the remainder of said semiconductor substrate.

2. A method as claimed in claim 1, wherein the disordered region is amorphous.

3. A method as claimed in claim 1, wherein the wavelength is determined in said step b) further based on the absorption length of the radiant energy in the disordered region.

4. A method as claimed in claim 1, wherein the wavelength of the radiant energy is determined in said step b) further based on the absorption length of the radiant energy in the crystalline substrate.

5. A method as claimed in claim 1, wherein the radiant energy wavelength is determined in said step b) further based on having an absorption length in the disordered region that is greater than or equal to one-third (⅓) of the thickness of the disordered region.

6. A method as claimed in claim 1, wherein the radiant energy wavelength is determined in said step b) is further based on having an absorption length in the disordered region that is less than or equal to the larger of five times the thickness of the disordered region, and one micron.

7. A method as claimed in claim 1, wherein the radiant energy wavelength is determined in said step b) further based on having an absorption length in the crystalline substrate that is at least twice the absorption length of the wavelength in the disordered region.

8. A method as claimed in claim 1, wherein:
said semiconductor substrate further includes a field isolation region surrounding said disordered region; and
the radiant energy wavelength is determined in said step b) is further based on the absorption of the material composing the field isolation region being less than half as much as the absorption of a similar thickness of the material in the disordered region.

9. A method as claimed in claim 1, wherein the wavelength determined in said step b) is in a range from four-hundred-fifty (450) to nine-hundred (900) nanometers.

10. A method as claimed in claim 1, wherein the pulse length is determined in step c) further based on a thermal diffusion coefficient of the material in the disordered region.

11. A method as claimed in claim 1, wherein the pulse length determined in step c) is sufficiently short so that immediately after the pulse less than fifty percent (50%) of the energy imparted to the disordered region is conducted to the substrate.

12. A method as claimed in claim 1, wherein the pulse length as determined in step c) is sufficiently long to allow thermalization of the disordered region.

13. A method as claimed in claim 1, wherein the pulse length as determined in step c) is sufficiently long to permit energy from the radiant energy pulse to diffuse within the thickness of the disordered region during the interval of the radiant energy pulse, with the pulse length being greater than $(D_a)^2/a$ where Da is the thickness of the disordered region and a is the thermal diffusion coefficient of the disordered material.

14. A method as claimed in claim 1, wherein the pulse length is determined in said step c) to be in a range from one-tenth (0.1) to fifty (50) nanoseconds.

15. A method as claimed in claim 1, wherein the disordered region and crystalline substrate are composed primarily of silicon.

16. A method as claimed in claim 1, wherein the thickness of the disordered region is determined in said step a), based on the atomic weight of the ions, the dosage of ions, and the implantation energy used to implant the ions.

17. A method as claimed in claim 16, wherein the ions have the same chemical valency as the substrate, and are implanted to form the disordered region.

18. A method as claimed in claim 1, wherein the wavelength is determined in said step b) further based on the availability of a relatively efficient source of radiant energy which can be uniformly distributed over a relatively extended area and controlled with relative accuracy in terms of the energy content of each pulse.

19. A method as claimed in claim 1, wherein:
said semiconductor substrate further includes thereon a gate insulator layer and a gate conductor layer on said gate insulator layer adjacent said disordered regions; and
the wavelength is determined in said step b) is further based on the absorption of the radiant energy at the wavelength in the gate conductor layer and the underlying gate insulator layer not being substantially greater than the radiant energy absorbed in a similar thickness of the material of the disordered region.

20. A method as claimed in claim 1, wherein the ions are used to dope source and drain regions of the substrate.

21. A method as claimed in claim 1, further comprising the step of:
e) forming an anti-reflective layer over at least the disordered region to enhance the absorption of the incident radiant energy.

22. A method as claimed in claim 21, wherein the anti-reflective layer is composed of an oxide of the semiconductor substrate.

23. A method as claimed in claim 21, wherein the anti-reflective layer is composed of silicon oxide ($SiO_2$), silicon nitride ($Si_3N_4$), or silicon oxynitride ($SiO_xN_y$).

24. A method as claimed in claim 21, wherein the thickness of the anti-reflective layer is determined in accordance with the following equation:

anti-reflective layer thickness=$(k \cdot /)/(4n)$ where / is the wavelength of the radiant energy, n is the index of refraction of the anti-reflective layer, and k is an odd integer.

25. A method as claimed in claim 2 wherein step d) is performed by exposing the amorphous region with a pulse of radiant energy having the wavelength and pulse length determined in said steps b) and c) to heat the amorphous region through to the crystalline substrate to a temperature sufficient to initiate conversion of the amorphous material region to single crystal material aligned to a crystallization direction of the substrate, the converted region cooling after the performance of said step d).

26. A method as claimed in claim 2 wherein step d) is performed by exposing the disordered region with a pulse of radiant energy having the wavelength and pulse length determined in said steps b) and c) to heat the disordered region through to the crystalline substrate to a temperature sufficient to initiate activation of the dopant ions in the material composing the disordered region.

27. A method as claimed in claim 26, wherein the dopant ions are incorporated into the crystal lattice after performance of said step d) to convert the disordered region to a crystalline region integral with the substrate.

28. A method as claimed in claim 27, wherein said region becomes source and drain regions of an integrated transistor device formed on the substrate.

29. A method as claimed in claim 1 wherein step d) is performed by exposing the disordered region with the wavelength and pulse length determined in said steps b) and c) to heat the disordered region through to the crystalline substrate to anneal the disordered region.

30. A method as claimed in claim 29, wherein the dose of radiant energy delivered to the disordered region is in a range from one-tenth (0.1) to one (1.0) Joules per square centimeter ($J/cm^2$).

31. A method as claimed in claim 29, wherein the exposure in said step d) is performed with a single radiant energy pulse.

32. A method as claimed in claim 29, wherein the exposure in said step d) is performed with multiple pulses of radiant energy which impinge upon overlapping areas of the substrate.

33. A method as claimed in claim 29, wherein the radiant energy used in the performance of said step d) is generated by a laser.

34. A method as claimed in claim 33, wherein the laser generates radiant energy having a wavelength in a range from nine-hundred (900) to eighteen-hundred (1800) nanometers, the method further comprising the step of:

e) frequency-doubling the radiant energy before using the radiant energy to expose the disordered region in the performance of said step d).

35. A method for converting a disordered region on a crystalline semiconductor substrate disordered by implantation of dopant ions back into crystalline structure, said method comprising the steps of:

a) determining a thickness of said disordered region;

b) determining a wavelength of said radiant energy based on at least the thickness of said disordered region; and c) annealing said region with radiant energy sufficient to melt only said region without effecting the crystalline structure of the remainder of said semiconductor substrate.

36. A method as claimed in claim 35, wherein the radiant energy wavelength is determined in said step b) so that the radiant energy at the wavelength has an absorption length in the disordered region that is from one-third the thickness of the disordered region to the larger of five times the thickness of the disordered region and one micron.

37. A method as claimed in claim 35, wherein the radiant energy wavelength is determined in said step b) so that the radiant energy at the wavelength has an absorption length in the substrate that is at least twice the absorption length in the disordered region.

38. A method as claimed in claim 35, wherein:

said semiconductor substrate further includes a field isolation region surrounding said disordered region; and the radiant energy wavelength is determined in said step b) so that the absorption of radiant energy at the wavelength in the material composing the field isolation region is less than half as much as the absorption of radiant energy through a similar thickness of the material composing the disordered region.

39. A method as claimed in claim 35, wherein the radiant energy wavelength determined in said step b) is in a range from four-hundred-fifty (450) to nine-hundred (900) nanometers.

40. A method as claimed in claim 35, wherein the disordered region and the substrate are composed primarily of silicon.

41. A method as claimed in claim 35, wherein step c is performed by exposing the amorphous region with radiant energy of the wavelength determined in said step b) to heat the amorphous region through to the crystalline substrate sufficiently so that the amorphous region converts after the performance of said step c) into a crystalline region in contact and crystallographically aligned with the substrate.

42. A method as claimed in claim 35, wherein step c) is performed by exposing the disordered region with radiant energy of the wavelength determined in said step b) to heat the disordered region through to the crystalline substrate sufficiently so that at least some of the dopants in the disordered region are activated after the performance of said step c).

43. A method for converting a disordered region on a crystalline semiconductor substrate disordered by implantation of dopant ions back into crystalline structure, said method comprising the steps of:

a) determining a thickness of said disordered region;

b) determining a pulse length of said radiant energy based on at least the determined thickness of said disordered region; and c) annealing said region with radiant energy sufficient to melt only said disordered region without effecting the crystalline structure of the remainder of said semiconductor substrate.

44. A method as claimed in claim 43, wherein the pulse length is determined in said step b) further based on the absorption length of the radiant energy at the wavelength in the disordered region.

45. A method as claimed in claim 43, wherein the pulse length is sufficiently short so that immediately after the pulse less than fifty (50%) percent of the radiant energy absorbed by the disordered region is lost by conduction to a portion of said substrate adjacent said disordered region.

46. A method as claimed in claim 43, wherein the pulse length is sufficiently long so that thermal energy can diffuse within the disordered region's thickness within the time interval of the pulse length, with the pulse length being greater than $(D_a)^2/a$ where $D_a$ is the thickness of the amorphous region and a is the thermal diffusion coefficient of the amorphous material.

47. A method as claimed in claim 43, wherein the pulse length is determined to be within a range from one-tenth (0.1) to fifty (50) nanoseconds.

48. A method as claimed in claim 43, wherein the disordered region and substrate are composed primarily of silicon.

49. A method as claimed in claim 43, wherein step c) is performed by exposing the amorphous region with radiant energy of the pulse length determined in said step b) to convert the amorphous region to a crystalline region aligned with the crystal axis of the substrate.

50. A method as claimed in claim 43, wherein step c) is performed by exposing the disordered region with radiant energy of the pulse length determined in said step b) to convert the disordered region into a converted region in which at least some of the dopant ions are located at active sites within the crystalline lattice of the converted region.

51. A method of making an integrated transistor device on a crystalline semiconductor substrate, said method comprising the steps of:

a) implanting dopant ions of one of n and p conductivity types into a surface of said crystalline semiconductor substrate to form a well region of a first conductivity type having a first thickness;

b) implanting dopant ions of the other conductivity type from that used to form said well region into two separated regions of said well region that will become source and drain regions of said integrated transistor device with said two separated regions becoming disordered regions each of a second thickness with said second thickness being less than said first thickness; and c) determining said second thickness;

d) exposing the two separated disordered regions with radiant energy of a wavelength from four-hundred-fifty (450) to nine-hundred (900) nanometers, a pulse length of one-tenth (0.1) to fifty (50) nanoseconds, and an energy dose of one-tenth (0.1) to one (1.0) Joules per square centimeter, to heat the disordered regions through to the crystalline substrate at said first thickness, the disordered regions cooling and crystallizing after the performance of said step c) to form annealed source and drain regions with the wavelength and pulse length each determined based on at least said second thickness.

52. A method as claimed in claim 51 prior to step b), further comprising the steps of:

d) forming field isolation regions on the semiconductor substrate;

e) forming a gate insulator layer on the substrate;

f) forming a gate conductor layer on the gate insulator layer; and g) patterning the gate insulator and conductor layers to form a gate region between locations for the source and drain regions.

53. A method as claimed in claim 51, prior to step c), further comprising the step of:

d) forming an anti-reflective layer over at least the disordered regions to enhance the absorption of the radiant energy in the performance of said step c).

54. A method as claimed in claim 53, wherein the anti-reflective layer is composed of an oxide of the semiconductor substrate.

55. A method as claimed in claim 53, wherein the substrate is composed of silicon and the anti-reflective layer is composed of silicon oxide ($SiO_2$), silicon nitride ($Si_3N_4$), or silicon oxynitride ($SiO_xN_y$).

56. A method as claimed in claim 53, wherein the thickness of the anti-reflective layer is determined based on the following equation:

anti-reflective layer thickness=$(k \cdot \lambda)/(4 \cdot n)$ where $\lambda$ is the wavelength of the radiant energy, n is the index of refraction of the overcoat anti-reflective layer, and k is an odd integer.

57. A method as claimed in claim 51, wherein the wavelength determined in said step d) is further based on the absorption length of the radiant energy in the disordered regions.

58. A method as claimed in claim 51, wherein the wavelength determined in said step d) is further based on the radiant energy at the wavelength having an absorption length in the disordered regions that is greater than or equal to one-third (⅓) of the second thickness of the disordered regions.

59. A method as claimed in claim 51, wherein the wavelength is determined in said step d) further based on the radiant energy at the wavelength having an absorption length in the disordered regions that is less than or equal to the greater of five times the second thickness of the disordered regions and one micron.

60. A method as claimed in claim 51, wherein the wavelength is determined in said step d) further based on the absorption of the radiant energy at the wavelength in the gate conductor layer and the underlying gate insulator layer not being substantially greater than the radiant energy absorbed in a similar thickness of the material in the disordered region.

61. A method as claimed in claim 51, wherein the wavelength determined in said step d) is further based on the radiant energy at the wavelength having an absorption length in the crystalline substrate that is at least twice the absorption length of the wavelength in the disordered regions.

62. A method as claimed in claim 51, wherein the wavelength determined in said step d) is further based on the absorption length of the radiant energy at the wavelength in the crystalline substrate.

63. A method as claimed in claim 51, wherein:

said semiconductor substrate further includes a field isolation region surrounding said disordered region; and the wavelength determined in said step d) is further based on the radiant energy at the wavelength having a higher transmission through a predetermined thickness of the material composing the field isolation region than through a similar thickness of the material composing the disordered regions.

64. A method as claimed in claim 51, wherein the pulse length is determined further based on the thermal diffusion coefficient of the disordered regions.

65. A method as claimed in claim 51, wherein the pulse length is sufficiently short so that immediately after the pulse less than fifty percent (50%) of all the radiant energy absorbed by the disordered regions is conducted into the substrate.

66. A method as claimed in claim 51, wherein the pulse length is sufficiently long to allow time for the temperature of the atomic nuclei in the crystal lattice of the disordered regions to come into equilibrium with the temperature of the electrons initially responsible for absorbing the incident radiant energy.

67. A method as claimed in claim 51, wherein the pulse length is sufficiently long to permit thermal energy to diffuse within the thickness of the disordered regions during the interval of the laser pulse, i.e., the pulse length is greater than $(D^a/a$ where $D_a$ is the thickness of the amorphous region and a is the thermal diffusion coefficient of the amorphous material.

68. A method as claimed in claim 51, wherein the radiant energy used in the exposing of said step c) is generated by a relatively efficient source which can be uniformly distributed over a relatively extended area and controlled with relative accuracy in terms of the energy content of each pulse.

69. A method as claimed in claim 51, wherein the disordered regions and crystalline substrate are composed primarily of silicon.

70. A method as claimed in claim 51, further comprising the step of:

d) determining thickness of the disordered regions before performing said step d).

71. A method as claimed in claim 70, wherein the disordered regions are created by implantation of dopant ions, and wherein the thickness of the disordered regions is determined based on the atomic weight of the dopant atoms, the dosage of the dopant atoms, and the implantation energy used to implant the dopant ions.

72. A method as claimed in claim 70, wherein said step e) is performed by measuring the thickness of the disordered regions.

73. A method as claimed in claim 50, wherein the exposure in said step c) is performed with a single pulse of radiant energy.

74. A method as claimed in claim 51, wherein the exposure in said step c) is performed with multiple pulses of radiant energy which impinge upon overlapping areas of the substrate.

75. A method as claimed in claim 51, wherein the radiant energy used in the performance of said step c) is generated by a laser.

76. A method as claimed in claim 75, wherein the laser is a YAG laser.

77. A method as claimed in claim 75, wherein the laser is a YAG laser designed such that the laser emits a minimum of one-thousand (1,000) spatial modes, or equivalently, has an $M^2$ (M-squared value) greater than about 30.

78. A method as claimed in claim 75, wherein the laser is an Alexandrite laser.

79. A method as claimed in claim 75, wherein the laser is an Alexandrite laser designed such that the laser emits a minimum of one-thousand (1,000) spatial modes or, equivalently, has an $M^2$ (M-squared value) greater than about 30.

80. A method as claimed in claim 75, wherein the laser is a Ti:sapphire laser.

81. A method as claimed in claim 75, wherein the laser is a Ti:Sapphire laser designed such that the laser emits a minimum of one-thousand (1,000) spatial modes or, equivalently, has an $M^2$ (M-squared value) greater than about 30.

82. A method as claimed in claim 75, wherein the radiant energy used in the performance of said step c) is generated by a solid-state laser.

83. A method as claimed in claim 75, wherein the radiant energy used in the performance of said step c) is generated by a solid-state laser designed such that the laser emits a minimum of one-thousand (1,000) of spatial modes or, equivalently, has an $M^2$ (M-squared value) greater than about 30.

84. A method as claimed in claim 75, wherein:

the laser generates radiant energy in a wavelength range from nine-hundred (900) to eighteen-hundred (1,800) nanometers; and the method further comprising the step of:

e) frequency-doubling the wavelength of the laser to generate the radiant energy used to expose the disordered regions in said step c).

85. A method as claimed in claim 51, further comprising the steps of:

h) forming a second insulator layer over the gate, source and drain regions;

i) etching the second insulator layer to define contact holes over the source, drain and gate regions of the integrated transistor devices;

j) forming a second conductive layer over the substrate;

k) patterning the second conductive layer to form conductive lines in contact with the source, drain and gate regions; and l) forming a third insulator layer over at least the conductive lines.

* * * * *